United States Patent
Nakayama et al.

(10) Patent No.: US 8,169,817 B2
(45) Date of Patent: May 1, 2012

(54) MAGNETORESISTIVE DEVICE AND MAGNETIC RANDOM ACCESS MEMORY

(75) Inventors: Masahiko Nakayama, Yokohama (JP); Hiroaki Yoda, Sagamihara (JP); Tadashi Kai, Tokyo (JP); Hisanori Aikawa, Yokohama (JP); Katsuya Nishiyama, Yokohama (JP); Jyunichi Ozeki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 267 days.

(21) Appl. No.: 12/715,699

(22) Filed: Mar. 2, 2010

(65) Prior Publication Data
US 2010/0238717 A1    Sep. 23, 2010

(30) Foreign Application Priority Data
Mar. 18, 2009   (JP) .................................. 2009-66274

(51) Int. Cl.
*G11C 11/00*  (2006.01)
(52) U.S. Cl. .......................... 365/158; 365/171; 365/173
(58) Field of Classification Search .................. 365/158, 365/171, 173
See application file for complete search history.

(56) References Cited

U.S. PATENT DOCUMENTS

| | | | |
|---|---|---|---|
| 5,903,526 A * | 5/1999 | Tabata ....................... | 428/819.2 |
| 6,256,223 B1 | 7/2001 | Sun | |
| 6,713,830 B2 * | 3/2004 | Nishimura et al. ........... | 257/421 |
| 7,313,013 B2 * | 12/2007 | Sun et al. ....................... | 365/158 |
| 7,663,197 B2 | 2/2010 | Nagase et al. | |
| 2009/0080238 A1 | 3/2009 | Yoshikawa et al. | |

\* cited by examiner

*Primary Examiner* — Son Dinh
(74) *Attorney, Agent, or Firm* — Oblon, Spivak, McClelland, Maier & Neustadt, L.L.P.

(57) ABSTRACT

A magnetoresistive device includes: a magnetic recording layer including a first magnetic layer having perpendicular magnetic anisotropy, and a second magnetic layer having in-plane magnetic anisotropy and being exchange-coupled to the first magnetic layer, Curie temperature of the second magnetic layer being lower than Curie temperature of the first magnetic layer, and the magnetic recording layer having a magnetization direction perpendicular to a film plane; a magnetic reference layer having a magnetization direction which is perpendicular to a film plane and is invariable; and a nonmagnetic layer provided between the magnetic recording layer and the magnetic reference layer. The magnetization direction of the magnetic recording layer is changeable by spin-polarized electrons caused by flowing current between the magnetic recording layer and the magnetic reference layer in a direction perpendicular to the film plane.

11 Claims, 7 Drawing Sheets

MAGNETORESISTIVE DEVICE AND MAGNETIC RANDOM ACCESS MEMORY

CROSS-REFERENCE TO RELATED APPLICATION

This application is based upon and claims the benefit of priority from prior Japanese Patent Application No. 2009-66274 filed on Mar. 18, 2009 in Japan, the entire contents of which are incorporated herein by reference.

BACKGROUND OF THE INVENTION

1. Field of the Invention

The present invention relates to a magnetoresistive device and a magnetic random access memory.

2. Related Art

Various types of solid magnetic memories have been suggested. In recent years, magnetic random access memories (MRAM) that use magnetoresistive devices showing the giant magnetoresistive (GMR) effect have been suggested, and attention has been drawn particularly to magnetic random access memories that use ferromagnetic tunnel junctions showing the tunneling magnetoresistive (TMR) effect.

A MTJ (Magnetic Tunnel Junction) device including a ferromagnetic tunnel junction includes a stack structure normally formed with a first ferromagnetic layer, an insulating layer, and a second ferromagnetic layer. At the time of reading, current flows, tunneling through the insulating layer. In this case, the junction resistance value varies with the cosine of the relative angle between the magnetization direction of the first ferromagnetic layer and the magnetization direction of the second ferromagnetic layer. Accordingly, the resistance value of the ferromagnetic tunnel junction is smallest when the magnetization directions of the first ferromagnetic layer and the second ferromagnetic layer are parallel to each other, and is largest when the magnetization directions of the first ferromagnetic layer and the second ferromagnetic layer are antiparallel to each other. This is called the TMR effect. The change rate of the resistance value due to the TMR effect sometimes exceeds 300% at room temperature.

In a memory cell that includes the ferromagnetic tunnel junction as a ferromagnetic memory device, at least one of the ferromagnetic layers is regarded as a magnetic reference layer (also referred to as a fixed magnetization layer, a reference layer, or a pinned layer), and the magnetization direction of the ferromagnetic layer is fixed. The other one of the ferromagnetic layers is regarded as a recording layer (also referred to as a magnetic recording layer, a free layer, or a variable layer). In this memory cell, the magnetization directions of the magnetic reference layer and the magnetic recording layer are in a parallel state or in an antiparallel state, and the binary information of "0" and "1" is associated with the parallel state and the antiparallel state. In this manner, information is written. To write recording information, the magnetization of the magnetic recording layer is reversed by the magnetic field generated by the current flowing into a write wiring provided for this memory cell (a current magnetic-field reversal method). Alternatively, the magnetization of the magnetic recording layer is reversed by the spin torque injected from the magnetic reference layer by directly energizing the device (a spin-injection magnetization reversal method (see U.S. Pat. No. 6,256,223, for example)). Reading is performed by applying current to the ferromagnetic tunnel junction and detecting a resistance variation caused by the TMR effect. A large number of such memory cells are arranged, to form a magnetic memory. In an actual structure, a switching transistor is provided in each of the cells as in a DRAM, and peripheral circuits are incorporated into the structure, so that any desired cell can be selected.

To realize a large-capacity memory, it is necessary to miniaturize each device, and increase the cell occupancy in the chip. The spin-injection magnetization reversal method requires a much smaller amount of current for writing information than the conventional current magnetic-field reversal method. For this reason, the spin-injection magnetization reversal method is a write method suitable for realizing a large-capacity magnetic memory.

When a magnetic memory of the spin-injection magnetization reversal type is used in practice, the write current applied to the devices should preferably not change with temperature. This is because, if the write current has large temperature dependence, it is necessary to prepare a circuit that adjusts the write current every time the temperature fluctuates, and the cell area of the memory becomes larger.

In a conventional magnetic memory of the current magnetic-field reversal type that utilizes the shape magnetic anisotropy of a magnetic film having magnetization substantially parallel to the film plane (in-plane magnetization), the magnetic anisotropy changes in proportion mainly with the saturation magnetization. Since the temperature dependence of the saturation magnetization of the magnetic layer is expressed as a Brillouin function, the temperature dependence is small at temperatures close to room temperature. Accordingly, the temperature dependence of the magnetic anisotropy is small, and the temperature dependence of the current magnetic field required for a reversal is also small, which has not raised any problem.

In a magnetic memory of the spin-injection magnetization reversal type that utilizes the magnetization substantially perpendicular to the film plane (perpendicular magnetization), however, the energy required for a spin injection reversal changes in proportion to the magnetic anisotropy of each device. Therefore, it is difficult to guarantee a temperature range of below zero to 150° C. as required for an in-vehicle memory, for example. This still remains a problem.

SUMMARY OF THE INVENTION

The present invention has been made in view of the above circumstances, and an object thereof is to provide a magnetoresistive device that has a spin-injection reversal current with small temperature dependence, and is capable of writing through stable spin-injection magnetization reversals, and a magnetic random access memory including the magnetoresistive device.

A magnetoresistive device according to a first aspect of the present invention includes: a magnetic recording layer including a first magnetic layer having perpendicular magnetic anisotropy, and a second magnetic layer having in-plane magnetic anisotropy and being exchange-coupled to the first magnetic layer, Curie temperature of the second magnetic layer being lower than Curie temperature of the first magnetic layer, and the magnetic recording layer having a magnetization direction perpendicular to a film plane; a magnetic reference layer having a magnetization direction which is perpendicular to a film plane and is invariable; and a nonmagnetic layer provided between the magnetic recording layer and the magnetic reference layer, the magnetization direction of the magnetic recording layer being changeable by spin-polarized electrons caused by flowing current between the magnetic recording layer and the magnetic reference layer in a direction perpendicular to the film plane.

A magnetic random access memory according to a second aspect of the present invention includes: the magnetoresistive device according to the first aspect; a first wiring electrically connected to one end of the magnetoresistive device; and a second wiring connected to the other end of the magnetoresistive device.

DETAILED DESCRIPTION OF THE INVENTION

Figure 1:
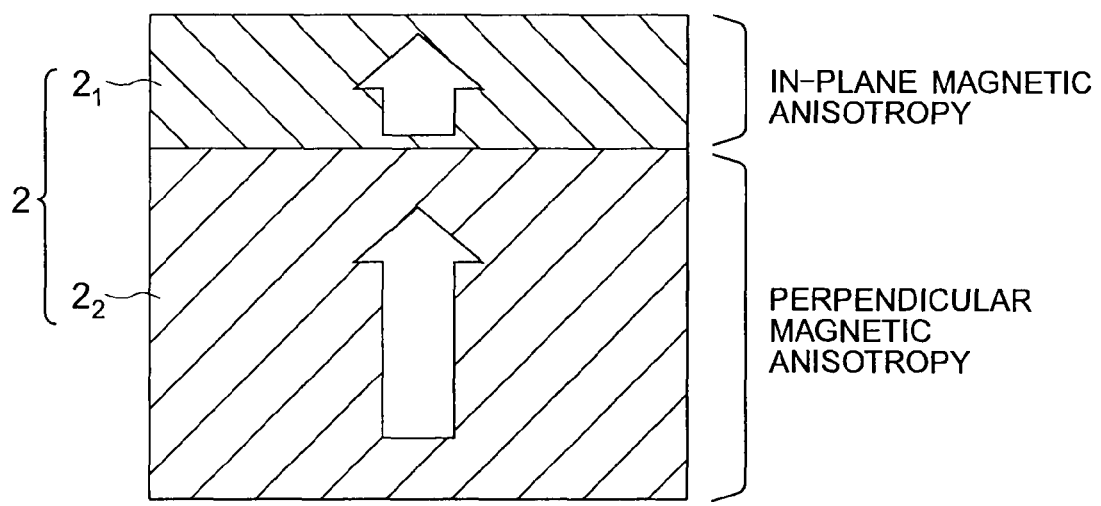
FIG. 1 is a cross-sectional view showing a magnetic recording layer that is used in the magnetoresistive device of each embodiment.

Referring to FIG. 1, the structure of a magnetic recording layer that is used in a magnetoresistive device of each embodiment is described prior to the description of the embodiments of the present invention. The magnetoresistive device of each embodiment includes a magnetic recording layer, a magnetic reference layer, and a tunnel barrier layer that is made of a nonmagnetic material and is provided between the magnetic recording layer and the magnetic reference layer. FIG. 1 shows the magnetic recording layer 2 that is used in the magnetoresistive device of each embodiment. This magnetic recording layer 2 includes a magnetic layer $2_1$ that has in-plane magnetic anisotropy (magnetic anisotropy having a magnetization easy axis substantially parallel to the film plane) and has a low Curie point, and a magnetic layer $2_2$ that has perpendicular magnetic anisotropy (magnetic anisotropy having a magnetization easy axis substantially perpendicular to the film plane). The magnetic layer $2_1$ and the magnetic layer $2_2$ are exchange-coupled to each other.

Normally, perpendicular magnetic anisotropy is larger than in-plane magnetic anisotropy. Therefore, when the magnetic layer $2_2$ having perpendicular magnetic anisotropy and the magnetic layer $2_1$ having in-plane magnetic anisotropy are exchange-coupled to each other, the magnetization of the magnetic layer $2_1$ having in-plane magnetic anisotropy is oriented in the plane perpendicular direction due to the larger perpendicular magnetic anisotropy, as shown in FIG. 1. Here, the plane perpendicular direction is a direction substantially perpendicular to the upper face of the magnetic layer.

The perpendicular magnetic anisotropy $K_{ueff}$ of the entire magnetic recording layer 2 having the above structure is expressed by the following equation:

$$K_{ueff}(V_1+V_2)=K_{u2}V_2-(2\pi M_{s1}^2 V_1+2\pi M_{s2}^2 V_2) \quad (1)$$

Here, $K_{u2}$ represents the perpendicular magnetic anisotropy of the magnetic layer $2_2$, $V_1$ and $V_2$ represent the volumes of the magnetic layer $2_1$ and the magnetic layer $2_2$, respectively, and $M_{s1}$ and $M_{s2}$ represent the saturation magnetization of the magnetic layer $2_1$ and the saturation magnetization of the magnetic layer $2_2$, respectively.

Figure 2:
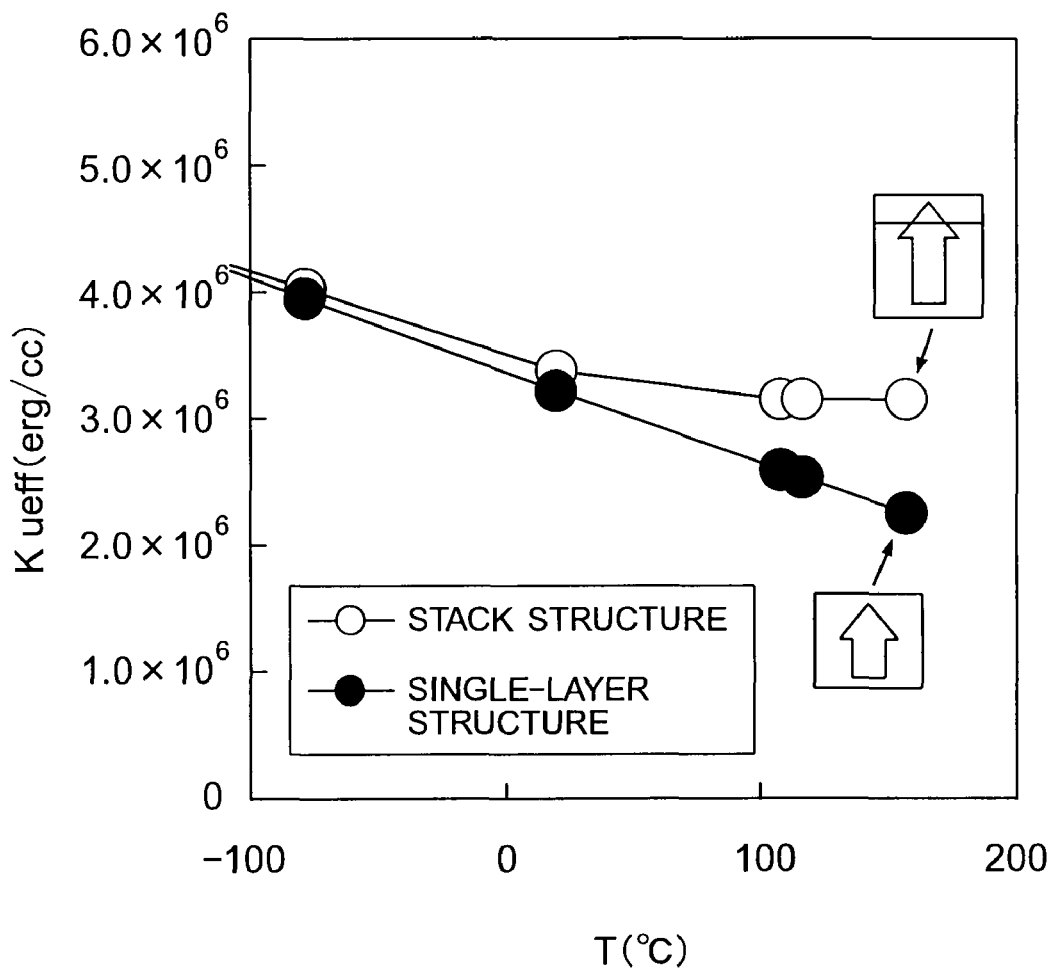
FIG. 2 is a diagram showing the temperature dependence of the magnetic anisotropy energy of the magnetic recording layer used in each embodiment.

When the temperature rises, the perpendicular magnetic anisotropy $K_{u2}$ of the magnetic layer $2_2$ normally becomes lower. If the Curie temperature of the magnetic layer $2_1$ is lower than the Curie temperature of the magnetic layer $2_2$, the saturation magnetization $M_{s1}$ of the magnetic layer $2_1$ decreases more rapidly than the saturation magnetization $M_{s2}$ of the magnetic layer $2_2$. Therefore, when the temperature rises, the variation of the perpendicular magnetic anisotropy $K_{ueff}$ with temperature is smaller than the variation in a case where the magnetic layer $2_2$ is the single magnetic layer in the magnetic recording layer 2 or where the magnetic layer $2_1$ does not exist in the magnetic recording layer 2, as can be seen from the equation (1). This is because, the perpendicular magnetic anisotropy $K_{ueff}$ of the magnetic recording layer 2 becomes larger as the saturation magnetization Ms becomes smaller, as shown in the equation (1). Accordingly, the magnetic layer $2_1$ corrects (adjusts) degradation of the temperature characteristics related to the magnetic anisotropy of the magnetic layer $2_2$. Referring now to FIG. 2, this aspect is explained.

FIG. 2 shows the results of calculations performed to determine the normalized temperature dependence of the perpendicular magnetic anisotropy $K_{ueff}$ of the magnetic recording layer 2 both in a case where the magnetic recording layer 2 has the magnetic layer $2_2$ as the single magnetic layer (in the case of a single-layer structure) and in a case where the magnetic layer $2_1$ and the magnetic layer $2_2$ are stacked and are exchange-coupled to each other (in the case of a stack structure). Here, the Curie temperature of the magnetic layer $2_1$ is 200° C., the saturation magnetization $M_{s1}$ is 1000 emu/cc, the Curie temperature of the magnetic layer $2_2$ is 700° C., the saturation magnetization $M_{s2}$ is 500 emu/cc, and the volume ratio $V_1/V_2$ between the magnetic layer $2_1$ and the magnetic layer $2_2$ is ¼. As can be seen from FIG. 2, the change rate of the perpendicular magnetic anisotropy $K_{ueff}$ with temperature between the room temperature of 25° C. and 85° C. is 85% in the case of the single-layer structure, and is 97% in the case of the stack structure. This makes it apparent that the variation of the perpendicular magnetic anisotropy $K_{ueff}$ of the magnetic recording layer 2 with temperature is smaller when the magnetic layer $2_1$ exists. The spin-injection reversal current of the magnetic recording layer 2 is expressed by the following equation (2):

$$I_c = \frac{2e}{\hbar} \frac{\alpha_{damp}}{g(\theta)} V_2 K_{ueff} \quad (2)$$

Here, e represents the elementary charge, $\alpha_{damp}$ represents the damping constant, $V_2$ represents the volume of the magnetic layer $2_2$, and H represents the Dirac constant obtained by dividing the Planck's constant h by $2\pi$. Further, $g(\theta)$ is expressed by the following equation (3):

$$g(\theta) = \frac{1}{2}\frac{P}{1+P^2\cos\theta} \quad (3)$$

Here, P represents the polarizability, and θ represents the relative angle between the magnetization directions of the magnetic recording layer and the magnetic reference layer.

The spin-injection reversal current normally changes in proportion to the perpendicular magnetic anisotropy $K_{ueff}$ of the magnetic recording layer 2. For example, the magnetic recording layer having the stack structure shown in FIG. 1 can be used to realize a memory that has small changes in the spin-injection reversal current within a wide temperature range required in practice, because the variation of the perpendicular magnetic anisotropy $K_{ueff}$ of the magnetic recording layer 2 with temperature is small.

As an example structure of the magnetic recording layer 2 used in each embodiment of the present invention, the following combination may be considered. The magnetic layer $2_1$ having in-plane magnetic anisotropy in the magnetic recording layer 2 having the above described stack structure is preferably formed with a ferromagnetic alloy that contains at least one element selected from the group consisting of Co, Fe, and Ni, and at least one nonmagnetic element selected from the group consisting of Mn, V, Ru, Cr, Cu, Au, Ag, and Al. The magnetic layer $2_2$ having perpendicular magnetic anisotropy in the magnetic recording layer 2 is preferably formed with a ferromagnetic intermetallic compound that contains at least one element selected from the group consisting of Co, Fe, and Ni, and at least one element selected from the group consisting of Pt, Pd, Rh, Ir, V, and Au.

Figure 3:
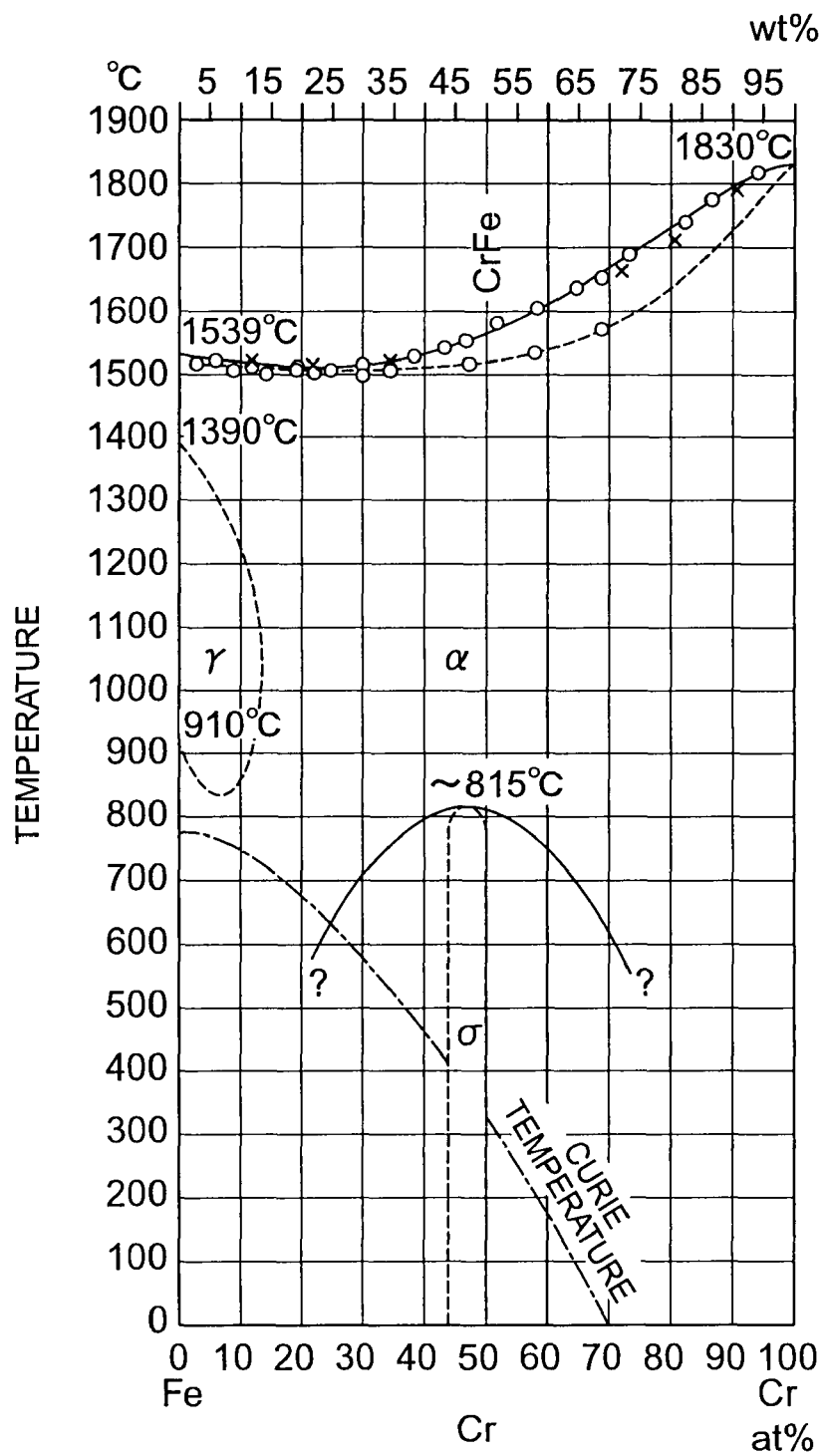
FIG. 3 is a diagram showing the Cr composition dependence of the Curie temperature of Fe—Cr alloys.

When a nonmagnetic element such as Cr is added to a ferromagnetic material, the Curie temperature normally drops. Accordingly, a magnetic layer that has in-plane magnetic anisotropy having a Curie temperature low enough for the magnetic recording layer 2 of each embodiment can be realized. FIG. 3 shows the Cr composition dependence of the Curie temperature in a case where Cr is added to Fe, for example (see Magnetic Material Handbook, Asakura Publishing Co., Ltd., 1975). As can be seen from FIG. 3, where Fe is used as the base material of the magnetic layer $2_1$ having in-plane magnetic anisotropy, and Cr is used as the additional material, Cr is added approximately 50% to 60%, so that the magnetic layer $2_1$ having in-plane magnetic anisotropy with small temperature dependence can be realized as required for the magnetic recording layer 2 of each embodiment. Alternatively, the magnetic layer $2_1$ having in-plane magnetic anisotropy in the magnetic recording layer 2 may be formed with a ferrimagnetic alloy or a ferrimagnetic intermetallic compound that contains at least one element selected from the group consisting of Co, Fe, and Ni, and at least one element selected from the group consisting of Nd, Tb, Dy, Ho, Sm, Mn, and V. When a rare-earth element or a transition metal element of a certain type is added to a ferromagnetic material, a ferrimagnetic material is normally formed, and its Curie temperature tends to be lower than the Curie temperature of a ferromagnetic material. Accordingly, the magnetic layer $2_1$ having in-plane magnetic anisotropy with a low Curie temperature can be realized as required in each embodiment of the present invention.

First Embodiment

Figure 4:
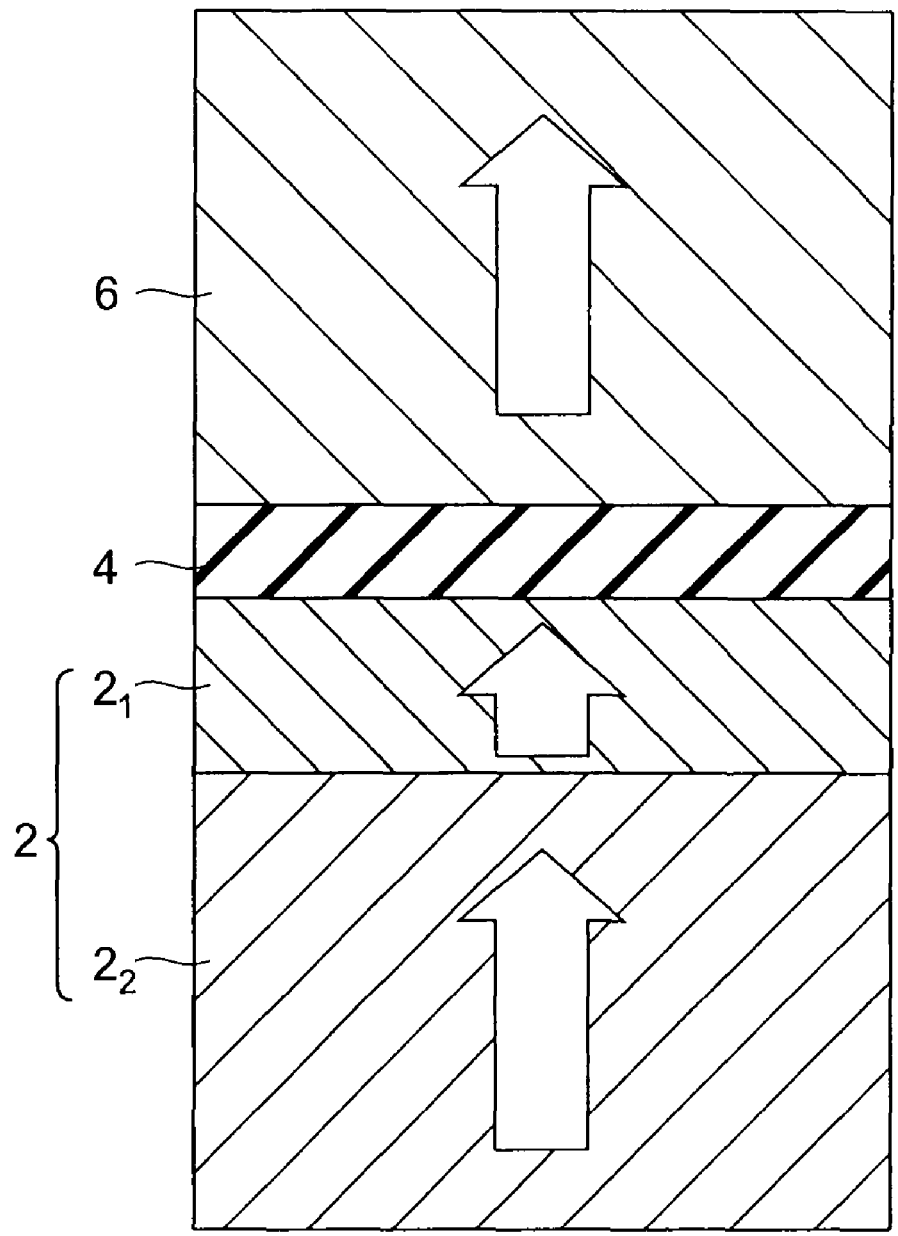
FIG. 4 is a cross-sectional view showing a magnetoresistive device of a spin-injection reversal type according to a first embodiment.

FIG. 4 shows a magnetoresistive device according to a first embodiment of the present invention. The magnetoresistive device 1 of this embodiment includes a magnetic recording layer 2 that has a changeable magnetization direction and records information depending on the magnetization direction, a magnetic reference layer 6 that has an invariable magnetization direction substantially perpendicular to the film plane or has a larger magnetization reversal magnetic field than the magnetic recording layer 2, and a tunnel barrier layer 4 that is provided between the magnetic recording layer 2 and the magnetic reference layer 6. The invariable magnetization direction means that the magnetization direction after flowing spin-polarized electrons is the same as the magnetization direction before flowing the spin-polarized electrons in writing operation. The magnetic recording layer 2 includes a magnetic layer $2_1$ that has in-plane magnetic anisotropy, and a magnetic layer $2_2$ that has perpendicular magnetic anisotropy. The magnetic layer $2_1$ and the magnetic layer $2_2$ are exchange-coupled to each other. The Curie temperature of the magnetic layer $2_1$ is lower than the Curie temperature of the magnetic layer $2_2$.

In this embodiment, to switch the magnetization direction of the magnetic recording layer 2 from a direction substantially parallel to (the same direction as) the magnetization direction of the magnetic reference layer 6 to a direction substantially antiparallel to (the opposite direction from) the magnetization direction of the magnetic reference layer 6, spin-polarized electrons (in the opposite direction from the current flow) are caused to flow from the magnetic recording layer 2 into the magnetic reference layer 6 via the tunnel barrier layer 4. When spin-polarized electrons are caused to flow from the magnetic recording layer 2 into the magnetic reference layer 6 via the tunnel barrier layer 4 in this case, the electrons spin-polarized in the same direction as the magnetization direction of the magnetic reference layer 6 pass through the magnetic reference layer 6. However, the electrons spin-polarized in the opposite direction from the magnetization direction of the magnetic reference layer 6 are reflected by the magnetic reference layer 6. The reflected electrons flow into the magnetic recording layer 2 through the tunnel barrier layer 4, and reverse the magnetization of the magnetic recording layer 2.

To switch the magnetization direction of the magnetic recording layer 2 from a direction substantially antiparallel to the magnetization direction of the magnetic reference layer 6 to a direction substantially parallel to the magnetization direction of the magnetic reference layer 6, spin-polarized electrons (in the opposite direction from the current flow) are caused to flow from the magnetic reference layer 6 into the magnetic recording layer 2 via the tunnel barrier layer 4. In this case, the electrons spin-polarized in the same direction as the magnetization direction of the magnetic recording layer 2 pass through the magnetic recording layer 2. However, the electrons spin-polarized in the opposite direction from the magnetization direction of the magnetic recording layer 2 reverse the magnetization of the magnetic recording layer 2.

With this structure, the magnetic layer $2_1$ having in-plane magnetic anisotropy can improve the temperature characteristics related to the magnetic anisotropy of the magnetic layer $2_2$. Accordingly, the temperature dependence of the spin-injection reversal current is low, and writing can be performed through stable spin-injection magnetization reversals.

The magnetoresistive device 1 shown in FIG. 4 has a stack structure in which the magnetic layer $2_2$, the magnetic layer $2_1$, the tunnel barrier layer 4, and the magnetic reference layer 6 are stacked in this order. However, those layers may be stacked in the reverse order from the above. More specifically, the magnetic reference layer 6, the tunnel barrier layer 4, the magnetic layer $2_1$, and the magnetic layer $2_2$ may be stacked in this order. The tunnel barrier layer 4 is formed with a nonmagnetic layer such as a MgO layer or an AlOx layer. The magnetic reference layer 6 is preferably formed with a ferromagnetic intermetallic compound that contains at least one element selected from the group consisting of Co, Fe, and Ni, and at least one element selected from the group consisting of Pt, Pd, Rh, Ir, V, and Au.

In this embodiment, the magnetic layer $2_1$, which improves the temperature characteristics related to the magnetic anisotropy of the magnetic layer $2_2$, is located adjacent to the tunnel barrier layer 4, as shown in FIG. 4. However, the magnetic layer $2_1$ may be placed on the opposite side of the magnetic layer $2_2$ from the tunnel barrier layer 4. In this case, a stack structure is formed by stacking the magnetic layer $2_1$, the magnetic layer $2_2$, the tunnel barrier layer 4, and the magnetic reference layer 6 in this order. The layers of this stack structure may be stacked in the reverse order from the above. Where the magnetic layer $2_1$ is placed on the opposite side of the magnetic layer $2_2$ from the tunnel barrier layer 4 as described above, insufficient achievement of the TMR effect can be prevented even if the spin polarizability of the magnetic layer $2_1$ becomes lower due to the addition of a nonmagnetic metal to the magnetic layer $2_1$ having in-plane magnetic anisotropy.

As described above, according to this embodiment, the temperature dependence of the spin-injection reversal current is low, and writing can be performed through stable spin-injection magnetization reversals.

Second Embodiment

Figure 5:
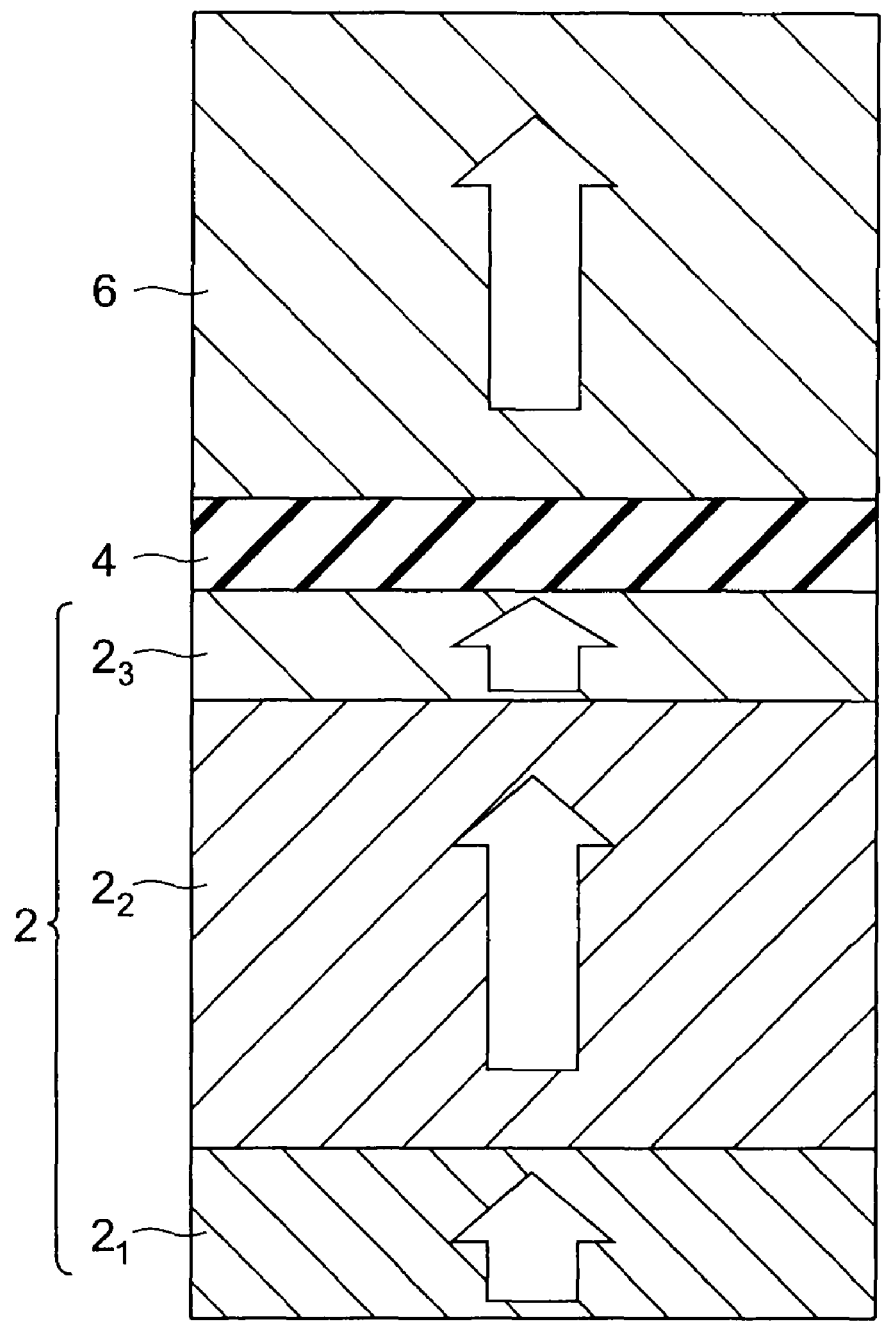
FIG. 5 is a cross-sectional view showing a magnetoresistive device of a spin-injection reversal type according to a second embodiment.

FIG. 5 shows a magnetoresistive device according to a second embodiment of the present invention. The magnetoresistive device 1 of this embodiment includes a magnetic recording layer 2 that has a changeable magnetization direction and records information depending on the magnetization direction, a magnetic reference layer 6 that has an invariable magnetization direction substantially perpendicular to the film plane or has a larger magnetization reversal magnetic field than the magnetic recording layer 2, and a tunnel barrier layer 4 that is provided between the magnetic recording layer 2 and the magnetic reference layer 6. The magnetic recording layer 2 includes a magnetic layer $2_1$ that has in-plane magnetic anisotropy, a magnetic layer $2_2$ that has perpendicular magnetic anisotropy, and a magnetic layer $2_3$ that has higher spin polarizability than the magnetic layer $2_1$ and the magnetic layer $2_2$. The magnetic layer $2_1$ and the magnetic layer $2_2$ are exchange-coupled to each other. The Curie temperature of the magnetic layer $2_1$ is lower than the Curie temperature of the magnetic layer $2_2$.

The magnetic layer $2_3$ having the high spin polarizability is placed on a side of the tunnel barrier layer 4. More specifically, in the magnetoresistive device 1 of this embodiment, the magnetic layer $2_1$, the magnetic layer $2_2$, the magnetic layer $2_3$, the tunnel barrier layer 4, and the magnetic reference layer 6 are stacked in this order. However, those layers may be stacked in the reverse order from the above. More specifically, the magnetic reference layer 6, the tunnel barrier layer 4, the magnetic layer $2_3$, the magnetic layer $2_2$, and the magnetic layer $2_1$ may be stacked in this order. Since the magnetic layer $2_3$ having high spin polarizability (0.4 or higher, for example) is provided on a side of the tunnel barrier layer 4 as described above, a sufficient TMR effect can be achieved.

The tunnel barrier layer 4 is formed with a nonmagnetic layer such as a MgO layer or an AlOx layer. The magnetic layer $2_3$ having the high spin polarizability may have in-plane magnetic anisotropy or perpendicular magnetic anisotropy. The magnetic layer $2_3$ having the high spin polarizability may be formed with a CoFeB alloy, a CoFe alloy, a Heusler alloy having a Fe or $L2_1$ ordered structure, or the like.

As in the first embodiment, the magnetic layer $2_1$ having in-plane magnetic anisotropy can improve the temperature characteristics related to the magnetic anisotropy of the magnetic layer $2_2$ in this embodiment. Accordingly, the temperature dependence of the spin-injection reversal current is low, and writing can be performed through stable spin-injection magnetization reversals.

Figure 6:
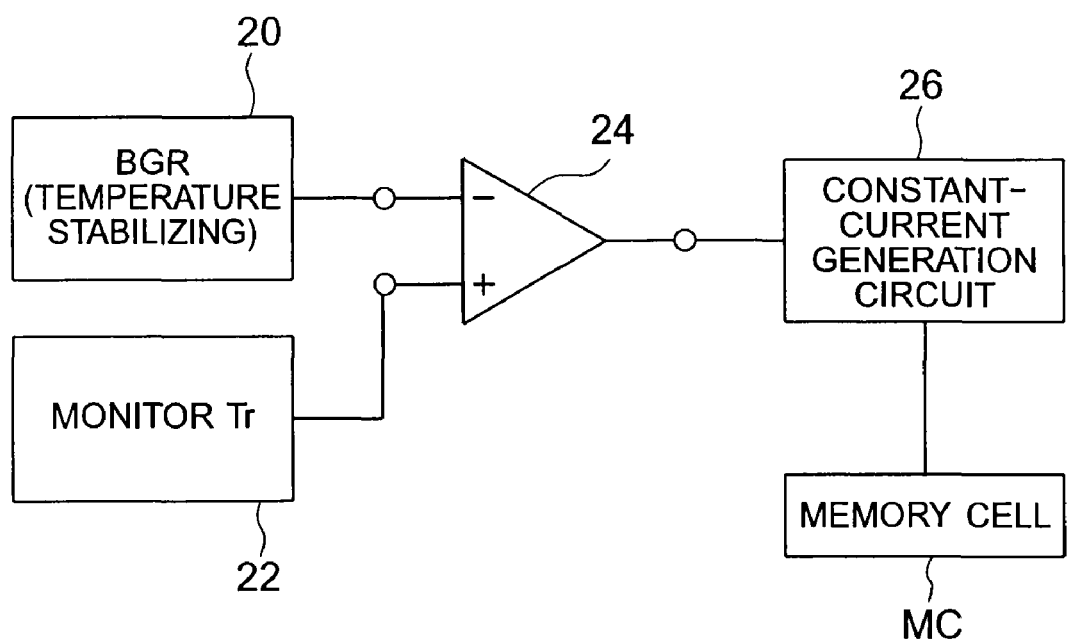
FIG. 6 is a diagram showing the current generation circuit of a magnetic random access memory of a spin-injection reversal type according to an embodiment of the present invention.

As described above, with the use of the magnetic recording layer 2 having the stack structure described in the above embodiment, the temperature dependence of the spin-injection reversal current can be restrained. However, if the spin-injection reversal current still has some temperature dependence, a temperature compensation circuit including a general temperature stabilizing (BGR (Band Gap Reference)) circuit should be incorporated into a constant-current generation circuit that generates the write current for a magnetic random access memory. FIG. 6 shows the circuit structure of a magnetic random access memory of the spin-injection reversal type that involves a temperature compensation circuit. First, a temperature stabilizing circuit 20 having a temperature-stabilizing output voltage and a known device 22 such as a transistor having an output voltage with temperature dependence are connected to the input terminals of a differential amplifier circuit 24. The output of the differential amplifier circuit 24 is connected to a constant-current generation circuit 26. The output current of the constant-current generation circuit 26 is varied in proportion to the input voltage from the differential amplifier circuit 24, so that a spin-injection write current with desired temperature dependence can be generated. The temperature dependence of the write current required by magnetic memory cells MC is measured in advance, and the output voltage of the differential amplifier circuit is adjusted so as to cancel the temperature dependence of the write current. In this manner, a magnetic memory of the spin-injection magnetization reversal type can be realized.

Third Embodiment

Figure 7:
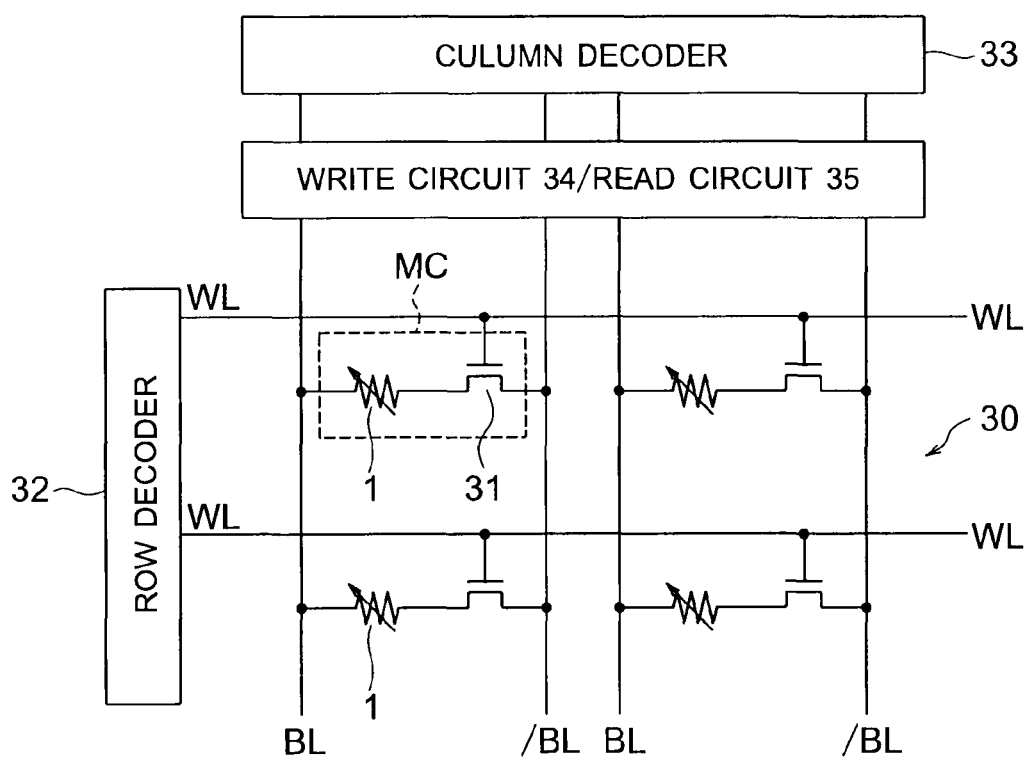
FIG. 7 is a circuit diagram showing a magnetic random access memory according to a third embodiment.

FIG. 7 shows a magnetic random access memory (MRAM) according to a third embodiment of the present invention. The MRAM of this embodiment includes a memory cell array 30 that has memory cells MC arranged in a matrix fashion. Each of the memory cells MC includes the magnetoresistive device 1 according to one of the first and second embodiments.

In the memory cell array 30, pairs of bit lines BL and /BL are arranged to extend in the column direction. In the memory cell array 30, word lines WL are also arranged to extend in the row direction.

The memory cells MC are placed at the respective intersecting points between the bit lines BL and the word lines WL. Each of the memory cell MC is formed with the magnetoresistive device 1 and a select transistor 31. One end of the magnetoresistive device 1 is connected to the corresponding bit line BL. The other end of the magnetoresistive device 1 is connected to the drain terminal of the select transistor 31. The gate terminal of the select transistor 31 is connected to the corresponding word line WL. The source terminal of the select transistor 31 is connected to the corresponding bit line /BL.

A row decoder 32 is connected to the word lines WL. A write circuit 34 and a read circuit 35 are connected to the pairs of bit lines BL and /BL. A column decoder 33 is connected to the write circuit 34 and the read circuit 35. Each of the memory cells MC is to be selected by the row decoder 32 and the column decoder 33.

Data is written into the memory cells MC in the following manner. First, to select the memory cell MC into which data is to be written, the word line WL connected to this memory cell MC is activated, and the select transistor 31 is switched on accordingly.

A bidirectional write current Iw is supplied to the magnetoresistive device 1. More specifically, when the write current Iw flowing from left to right is supplied to the magnetoresistive device 1, the write circuit 34 applies a positive potential to the bit line BL, and a ground potential to the bit line /BL. When the write current Iw flowing from right to left is supplied to the magnetoresistive device 1, the write circuit 34 applies a positive potential to the bit line /BL, and a ground potential to the bit line BL. In this manner, either the data "0" or the data "1" can be written into the memory cell MC.

Data is read from the memory cells MC in the following manner. First, one of the memory cells MC is selected. The read circuit 35 supplies the magnetoresistive device 1 with a read current Ir flowing from right to left, for example. Based on the read current Ir, the read circuit 35 detects the resistance value of the magnetoresistive device 1. In this manner, the information stored in the magnetoresistive device 1 can be read.

As described above, according to this embodiment, a MRAM can be formed with the use of the magnetoresistive device 1 of either the first or the second embodiment. By using the magnetoresistive device 1 of either the first or the second embodiment, the temperature dependence of the spin-injection reversal current is kept low, and writing can be performed through stable spin-injection magnetization reversals.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A magnetoresistive device comprising:
a magnetic recording layer including a first magnetic layer having perpendicular magnetic anisotropy, and a second magnetic layer having in-plane magnetic anisotropy and being exchange-coupled to the first magnetic layer, Curie temperature of the second magnetic layer being lower than Curie temperature of the first magnetic layer, and the magnetic recording layer having a magnetization direction perpendicular to a film plane;
a magnetic reference layer having a magnetization direction which is perpendicular to a film plane and is invariable; and
a nonmagnetic layer provided between the magnetic recording layer and the magnetic reference layer,
the magnetization direction of the magnetic recording layer being changeable by spin-polarized electrons caused by flowing current between the magnetic recording layer and the magnetic reference layer in a direction perpendicular to the film plane.

2. The device according to claim 1, wherein the second magnetic layer is provided on the first magnetic layer on a side opposite to a side on which the nonmagnetic layer is disposed.

3. The device according to claim 2, wherein the magnetic recording layer further includes a third magnetic layer that is interposed between the nonmagnetic layer and the first magnetic layer, and the third magnetic layer has higher spin polarizability than both of the first magnetic layer and the second magnetic layer.

4. The device according to claim 1 wherein
the first magnetic layer is formed with a ferromagnetic intermetallic compound that contains at least one element selected from the group consisting of Co, Fe, and Ni, and at least one element selected from the group consisting of Pt, Pd, Rh, Ir, V, and Au, and
the second magnetic layer is formed with a ferromagnetic alloy that contains at least one element selected from the group consisting of Co, Fe, and Ni, and at least one element selected from the group consisting of Mn, V, Ru, Cr, Cu, Au, Ag, and Al.

5. The device according to claim 1, wherein
the first magnetic layer is formed with a ferromagnetic intermetallic compound that contains at least one element selected from the group consisting of Co, Fe, and Ni, and at least one element selected from the group consisting of Pt, Pd, Rh, Ir, V, and Au, and
the second magnetic layer is formed with a ferromagnetic alloy or a ferrimagnetic intermetallic compound, each of the ferrimagnetic alloy and the ferrimagnetic intermetallic compound containing at least one element selected from the group consisting of Co, Fe, and Ni, and at least one element selected from the group consisting of Nd, Tb, Dy, Ho, Sm, Mn, and V.

6. A magnetic random access memory comprising:
the magnetoresistive device according to claim 1;
a first wiring electrically connected to one end of the magnetoresistive device; and
a second wiring connected to the other end of the magnetoresistive device.

7. The memory according to claim 6, further comprising a select transistor provided between the magnetoresistive device and the first wiring.

8. The memory according to claim 6, wherein the second magnetic layer is provided on the first magnetic layer on a side opposite to a side on which the nonmagnetic layer is disposed.

9. The memory according to claim 8, wherein the magnetic recording layer further includes a third magnetic layer that is interposed between the nonmagnetic layer and the first magnetic layer, and the third magnetic layer has higher spin polarizability than both of the first magnetic layer and the second magnetic layer.

10. The memory according to claim 6 wherein
the first magnetic layer is formed with a ferromagnetic intermetallic compound that contains at least one element selected from the group consisting of Co, Fe, and Ni, and at least one element selected from the group consisting of Pt, Pd, Rh, Ir, V, and Au, and
the second magnetic layer is formed with a ferromagnetic alloy that contains at least one element selected from the group consisting of Co, Fe, and Ni, and at least one element selected from the group consisting of Mn, V, Ru, Cr, Cu, Au, Ag, and Al.

11. The memory according to claim 6, wherein
the first magnetic layer is formed with a ferromagnetic intermetallic compound that contains at least one element selected from the group consisting of Co, Fe, and Ni, and at least one element selected from the group consisting of Pt, Pd, Rh, Ir, V, and Au, and
the second magnetic layer is formed with a ferromagnetic alloy or a ferrimagnetic intermetallic compound, each of the ferrimagnetic alloy and the ferrimagnetic intermetallic compound containing at least one element selected from the group consisting of Co, Fe, and Ni, and at least one element selected from the group consisting of Nd, Tb, Dy, Ho, Sm, Mn, and V.

* * * * *